DUAL DELAY AUTOMATIC GAIN CONTROL CIRCUIT

Filed Sept. 1, 1953 2 Sheets-Sheet 1

INVENTOR
JAMES EVERETT MCTAGGART

J. U. Douglas
ATTORNEY

Oct. 8, 1957 J. E. McTAGGART 2,809,287

DUAL DELAY AUTOMATIC GAIN CONTROL CIRCUIT

Filed Sept. 1, 1953 2 Sheets-Sheet 2

INVENTOR.
JAMES EVERETT McTAGGART
BY
J. D. Douglas
ATTORNEY

United States Patent Office 2,809,287

Patented Oct. 8, 1957

2,809,287

DUAL DELAY AUTOMATIC GAIN CONTROL CIRCUIT

James Everett McTaggart, Port Credit, Ontario, Canada, assignor to Admiral Corporation, Chicago, Ill., a corporation of Delaware Application September 1, 1953, Serial No. 377,914

3 Claims. (Cl. 250—20)

This invention relates to improvements in radio circuits and more particularly to an improved automatic gain control circuit which is useful in television receivers, although it is not necessarily limited thereto.

As is well known, to those versed in the art, it is common practice to develop a negative bias voltage from a received signal which bias voltage is usually applied to the control grids of one or more tubes in the receiver circuit to cause the gain of the circuit to be reduced as the signal strength increases and to thus prevent overloading of the circuit. It is desirable to have this control extend over a relatively wide range of signal strength. It so happens, however, that previous systems had certain disadvantages which the present system overcomes. In areas of very low signal strength it is desirable to have the highest sensitivity possible in order to receive the signal. This is effected by having the A. G. C. so designed that it does not develop any bias in the presence of low signals.

There is however a second area where there is an appreciable increase in strength in the signal and a bias voltage is developed to prevent overloading of the receiver. It has been found however that when this bias is applied to the R. F. stage of the tuner, it decreases the signal to noise ratio appreciably, with the result that the noise developed in the early stages of the receiver is evidenced by considerable "snow" in the picture. If this bias can be confined to the subsequent sections of the receiver, such as the intermediate frequency (I. F.) amplifier, the greater gain of the earlier stages (such as the tuner) is maintained and the signal to noise ratio is increased resulting in a decrease in noise in the picture. It is well known that an increase in noise factor or a decrease in signal to noise ratio is caused largely by the increase in bias on the R. F. amplifier grid of the tuner.

Another zone or area must also be considered however, and that is a zone of high or normal signal strength. In this zone it is desirable that both the tuner (R. F.) and I. F. stages be biased to prevent overloading of the receiver. This overloading may occur in the mixer as well as the later stages.

It is therefor desirable to minimize the bias voltage but to still apply enough to limit the gain of the stage, under conditions of increased signal strength and thus prevent overloading of the following converter or mixer stage.

By the circuit of my present invention I provide a system whereby the greater gain is realized in areas of very low signal strength and wherein the gain is decreased in the succceeding stages as the signal is increased without affecting the R. F. stages. I thus maintain a high signal to noise ratio in the presence of weak or medium strength signals. As the signal strength increases there is eventually a place where the control is also applied to the R. F. stage, at this time the signal is so large that the problem of noise due to bias in the R. F. amplifier is of no moment.

Briefly I accomplish the foregoing by providing an A. G. C. circuit wherein with signals of low strength no bias voltage is realized and wherein with signal of intermediate strength only the I. F. stages are biased and finally in the presence of strong signal bias is applied automatically to all the stages. The application of the bias therefor is progressively applied to the I. F. and tuner stages with an increase in signal strength.

Further advantages of the invention and the invention itself will become more apparent from the following description of an embodiment of my invention which is illustrated by the accompanying drawings, and wherein.

In the drawings like parts have been designated by like reference characters.

Briefly the invention includes a means for developing a negative bias voltage which is applied to one or more of the I. F. amplifier tubes and also to the tuner R. F. amplifier tube with means inserted in the A. G. C. line to the R. F. amplifier for delaying the application of a bias voltage to that amplifier until a signal of a predetermined strength is present.

Figure 1:
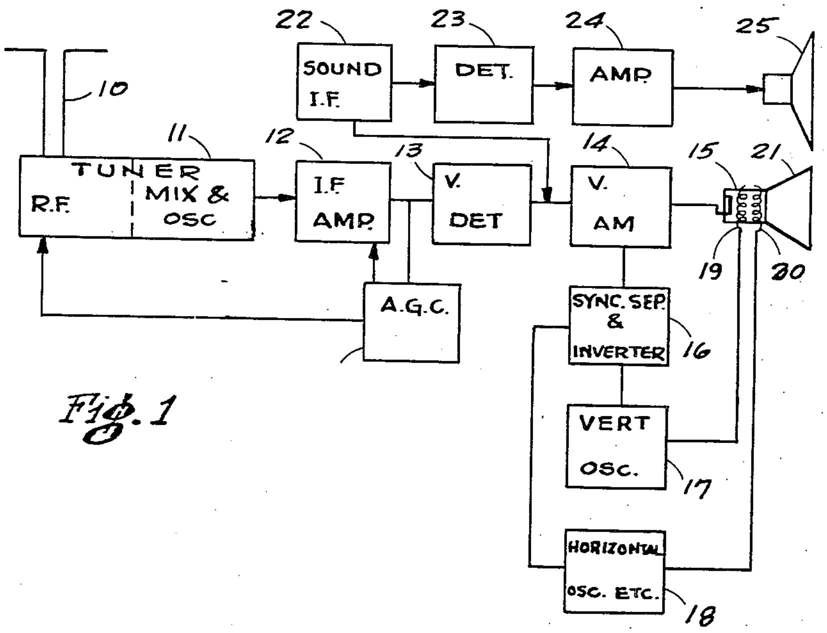
Fig. 1 is a block diagram of a television receiver in which my invention is useful.

In Fig. 1 there is shown a block diagram of a television receiver of the so called intercarrier sound type. It will be appreciated that although an intercarrier sound type of receiver is shown the invention is applicable to any type of receiver. In the receiver shown, there is provided an antenna 10 which is connected to a tuner 11 that may have the usual so called cascode R. F. amplifier and oscillator-mixer circuit where the signal is received and reduced to the lower I. F. frequency. The tuner connects to an I. F. amplifier 12, where the signal is amplified. From the I. F. amplifier the signal is transferred to the video detector 13 where it is rectified and applied to the video amplifier 14. From the video amplifier the signal is applied to the picture tube 15. The video amplifier also connects to the synchronizing (sync) separator and inverter circuit 16 which in turn connects to the vertical and horizontal sweep generator circuits 17 and 18, these being connected to the deflection coils 19 and 20 disposed around the neck of the picture tube 21.

The signal is also taken from the video detector circuit and fed to the sound I. F. amplifier, detector and audio amplifier 22, 23 and 24 and is then reproduced in the speaker 25.

The described block diagram as such is more or less conventional in television receivers.

Figure 2:
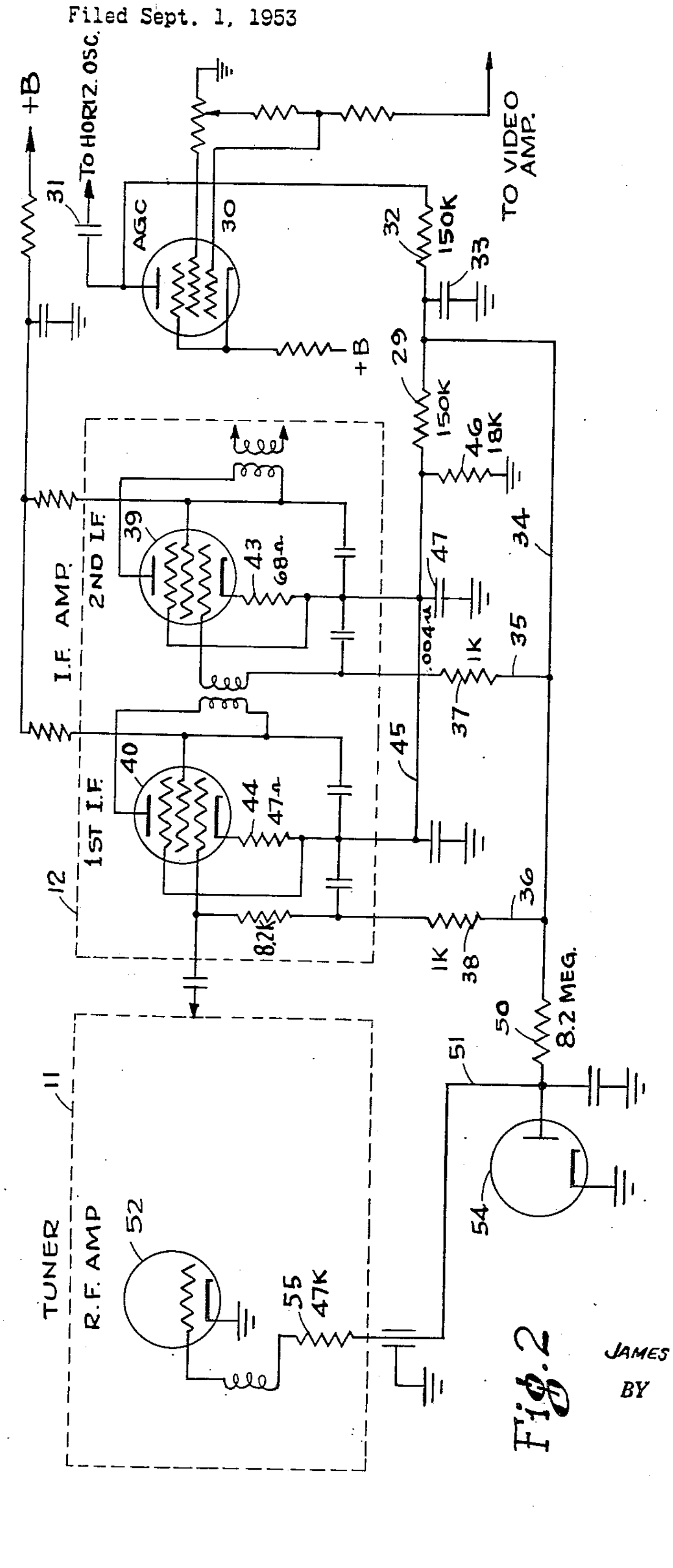
Fig. 2 is a schematic diagram of the portions of the receiver of Fig. 1 showing one application of my invention.

Fig. 2 represents certain of the components of the tuner and I. F. amplifier in greater detail and in conjunction with which the invention is applied. In this circuit there is illustrated the R. F. stage of the tuner, two of the I. F. stages and the A. G. C. tube together with the other components necessary to carry out my invention.

More specifically there is provided a so called gated A. G. C. tube 30, the function of which is well known in the art, it being understood that the plate voltage for this tube is supplied through the condenser 31 from the horizontal sweep generator and is rectified to supply pulses of voltage that vary in magnitude according to signal strength. These pulses are integrated in the integrating network 32 and 33 and are applied by the line 34 to the lines 35 and 36 and through the resistors 37 and 38 to the grids of the I. F. amplifier tubes 39 and 40.

The cathodes of the I. F. amplifier tubes with their respective cathode resistors 43 and 44, are tied together by the line 45 and grounded through the common resistor 46. The usual by-pass condenser 47 is provided across the resistor 46.

The A. G. C. line 34 also connects through a high resistance 50 by a line 51 to the grid of the R. F. amplifier tube 52 in the tuner 11. Also connected to the resistor 50 is the anode of a tube 54, the cathode of which is grounded. This tube may be one diode section of a 6AV6 type of tube the other elements of which may be used for other purposes in the receiver.

The resistor 29, connected between the integrating or filter circuit 32—33 to the common cathode resistor 46 and line 45, acts as a load resistor for the anode of the A. G. C. tube 30. The values of the more critical components are shown on the diagram. It will be appreciated however that these values may vary within limits depending upon the types of tubes being used and the exact manner in which the circuit is to operate.

An explanation of the operation can best be understood in connection with three different sets of receiving conditions.

The first condition is that of weak signal areas. At this time the greater sensitivity is desired; therefor no A. G. C. bias is developed and all the components illustrated are operating with their greatest sensitivity.

The second condition is that where a medium strength, but not strong, signal area is encountered. At this time the gain of the I. F. amplifier is reduced by the application of a negative bias to the grids but no bias is applied to the tuner, which continues to operate with a high gain, allowing it to remain particularly free from inherent noise because the signal on the grid is higher and the signal to noise ratio is high. The reduction of gain in the I. F. stages however prevents overloading of the following sections of the receiver.

The third condition is where the set is operated in normal or strong signal areas. At this time A. G. C. bias is supplied to both the I. F. amplifier and the tuner and the entire sensitivity of the set is reduced. Supplying a bias to the tuner prevents it from overloading, and, because the signal is strong, the picture is clean and without disturbing interference such as snow. At the same time since the set does not overload there is no loss of synchronization due to "sync" clipping and resultant distortion of the picture.

The operation of the circuit under the first condition is self evident. The control grid of tube 30 is connected through a voltage divider network to a typical video amplifier, receiving therefrom a positive bias voltage. The cathode of tube 30 is connected to a source of positive voltage of lower potential with respect to the control grid. Said bias prevents tube 30 from conducting, and therefore no A. G. C. voltage is developed. At this time the tubes 40—39 are drawing full current through resistor 46 with the result that the top end of this resistor is approximately 45 volts positive, and since there is little or no current through the resistor 29, the grid return line 34 is but slightly less positive than the line 45. Since line 34 is positive and is connected to the anode of the tube 54 through the resistor 50 the anode is positive and the tube is conducting and thus has a clamping action. The line 51 is practically zero or slightly negative due to the self bias of the resistor 55.

Figure 3:
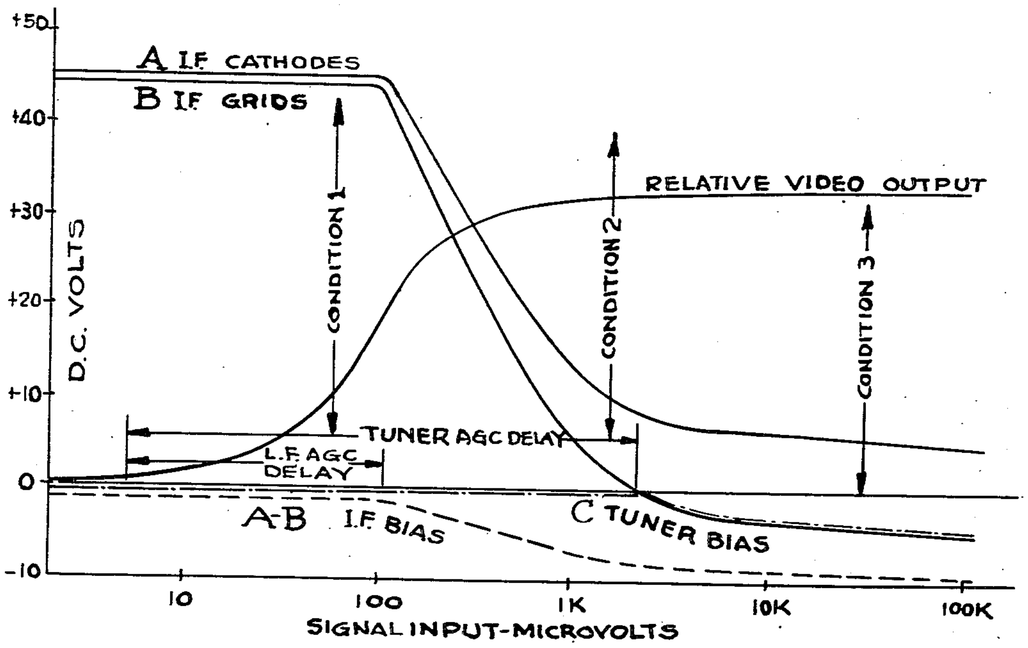
Fig. 3 is a graph illustrating the operation of the circuit of Fig. 2.

This condition is best shown by the graph of Fig. 3 where it will be seen that from a condition of no signal up to about 100 microvolts the I. F. cathodes and grids are all approximately the same potential and the tuner and I. F. bias is but slightly negative.

As the signal strength increases, the A. G. C. tube starts developing a bias, since the video output has now started to rise as indicated by the curve entitled "relative video output." The set is now going into condition two, representative of areas of increased but not strong signal strength.

It can be seen from the chart that the A. G. C. bias starts to take effect on the I. F. tubes at approximately 100 microvolts. The A. G. C. load 29, being in series with the cathode resistor 46 to ground, now has a current flowing through it, which increases with signal strength. This developed negative voltage is applied to the grids of tubes 39—40 which reduces the plate current through the resistor 46. This results in a reduction of a positive voltage on line 45. At the same time the voltage on line 34 is reduced becoming more negative than in line 45 but is still positive with respect to ground. The tube 54 still is conducting because the anode is above ground potential, therefore the line 51 and the grid of tube 52 receive no increased negative bias and the tuner is therefore still operating at high efficiency. This keeps the signal to noise ratio of the tube 52 high, but still allows the gain of I. F. to be reduced without overloading the receiver.

As can be seen from the chart, the I. F. bias keeps increasing with signal strength. At approximately 3000 microvolts, which is representative of the third condition, the I. F. bias is now negative by about 7.5 volts. At this time the voltage on the grids has been reduced to zero and the cathodes are less than 10 volts positive. In other words I. F. tubes 39—40 are biased nearly to cutoff, therefor the line 45 which connects to the cathodes is at a very low value and line 34 has now gone considerably negative. This causes the anode of tube 54 to go negative with respect to ground and tube 54 ceases to conduct and its clamping action is no longer exerted on the A. G. C. line 34; therefor the tuner is biased through the line 51 and its gain reduced. As can be seen by the chart the tuner bias for signals above 3000 microvolts follows very closely that of the I. F. grids.

Thus in areas of normal or high signal strength the R. F. amplifier tube of the tuner is prevented from overloading the mixer and this together with the A. G. C. bias on the grids keeps the receiver operating at the proper gain to prevent loss of "sync" by clipping. The signal on the R. F. tube now being large it overrides the inherent noise of the tube and the high signal to noise ratio is still retained.

As was previously intimated the selection of components to bring about the desired action may be varied. The delay is largely determined by the values of the resistors 29 and 46.

The graph clearly illustrates how the video output increases up to approximately 500 microvolts input and then levels off remaining substantially constant with increases of signal strength far above normal.

It will be appreciated that the tube 54 which can be a 6AV6 type tube may have two diodes and that only one need be used leaving the other open for other uses in the receiver.

Having thus described my invention I am aware that numerous extensive departures may be made therefrom without departing from the spirit or scope thereof.

I claim:

1. A radio frequency circuit including a pair of amplifiers, and a source of bias voltage for said amplifiers, an impedance network in common with said amplifiers and bias voltage source, means for causing a current flow from said amplifiers through said impedance network whereby a voltage is developed across said network in opposition to said bias voltage, and including delay means to retard the effect of said bias voltage upon one of said amplifiers until said bias voltage reaches and goes above a predetermined value, a second impedance network connected at the junction point of said bias voltage source and first mentioned impedance network, said second impedance network arranged to receive a resultant bias voltage from said delay means and providing a unilateral impedance to said resultant bias voltage during one operative condition of said circuit and an infinite impedance to said resultant bias voltage during a second operative condition of said circuit whereby the respective gains of said amplifiers are separately controlled.

2. A dual delay automatic gain control circuit for sequentially controlling the gain of a circuit having a radio frequency amplifier and an intermediate frequency amplifier, comprising a source of bias voltage for said amplifiers arranged to develop a bias output voltage proportioned to signal strength, said intermediate frequency amplifier including vacuum tubes each having at least a grid and a cathode with a cathode grounding resistor in the cathode circuit thereof, each said tube being arranged to draw maximum current under conditions when no signal is on the grid, and means connecting said source of bias voltage to said grids, resistance means connecting said source of bias voltage in series with said cathode resistor at the high potential end, said radio frequency amplifier including a vacuum tube having a grid and a cathode and resistance means connecting said source of bias voltage to said grid, a diode tube having an anode connected to the grid end of said last-mentioned resistance means and having a cathode connected to ground, said diode arranged to conduct and comprise a low impedance across said bias means in the presence of a bias voltage below a predetermined value.

3. A radio receiving circuit including at least a pair of amplifier tubes having input circuits including control grids and cathodes, one of said tubes preceding the other tube in said circuit, means for applying a bias to said grids such that the grid of the second tube is biased first in the presence of signals of a predetermined value and the grid of the first tube is biased in the presence of a signal greater than the signal necessary to bias the second tube, including a source of bias voltage arranged to produce a bias voltage proportional to the strength of the signal being received, means for connecting said source of bias voltage to the grid of said second tube and delay means acting in opposition to said bias means including a cathode grounding resistor disposed in the cathode circuit of said second tube and resistance means connecting said source of bias voltage to the cathode of said second tube at the cathode end of said grounding resistor, and means connecting said source of bias voltage to the grid of said first tube including a resistance, and a clamping tube having an anode connected to the grid end of said resistance and a cathode connected to ground, said clamping tube and said resistance providing a low impedance path for said bias voltage to the grid of the first tube and arranged to release its clamping action when the bias in the second tube reduces the current through the second tube to a predetermined value.

References Cited in the file of this patent

UNITED STATES PATENTS

| | | |
|---|---|---|
| 1,942,327 | Drake | Jan. 2, 1934 |
| 2,018,982 | Travis | Oct. 29, 1935 |
| 2,498,839 | Hayward | Feb. 28, 1950 |
| 2,632,802 | Vilkomerson et al. | Mar. 24, 1953 |
| 2,635,184 | Cotsworth | Apr. 14, 1953 |
| 2,756,327 | Keizer | July 24, 1956 |